US008707553B2

(12) United States Patent
Oggioni et al.

(10) Patent No.: US 8,707,553 B2
(45) Date of Patent: Apr. 29, 2014

(54) METHOD AND SYSTEM FOR IMPROVING ALIGNMENT PRECISION OF PARTS IN MEMS

(75) Inventors: Stefano S. Oggioni, Milan (IT); Michel Despont, Au (CH); Mark Lantz, Adliswil (CH); Thomas Albrecht, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 850 days.

(21) Appl. No.: 11/571,811

(22) PCT Filed: May 17, 2005

(86) PCT No.: PCT/EP2005/052248
§ 371 (c)(1),
(2), (4) Date: Jan. 22, 2009

(87) PCT Pub. No.: WO2006/005643
PCT Pub. Date: Jan. 19, 2006

(65) Prior Publication Data
US 2009/0211087 A1    Aug. 27, 2009

(30) Foreign Application Priority Data

Jul. 8, 2004  (EP) .................................... 04103257
May 17, 2005 (EP) .................................... 05749745

(51) Int. Cl.
*H05K 3/30*    (2006.01)
*H05K 3/20*    (2006.01)

(52) U.S. Cl.
USPC ................................ 29/834; 29/831; 29/832

(58) Field of Classification Search
USPC ............ 29/834, 825, 829, 831, 832; 257/777, 257/778
See application file for complete search history.

(56) References Cited

U.S. PATENT DOCUMENTS

| 5,214,308 | A | * | 5/1993  | Nishiguchi et al. ........... 257/692 |
| 5,395,099 | A | * | 3/1995  | Hall ................................ 269/47 |
| 5,849,946 | A | * | 12/1998 | Arndt et al. .................... 560/222 |
| 5,904,544 | A | * | 5/1999  | Zommer ........................ 438/454 |
| 6,037,666 | A | * | 3/2000  | Tajima .......................... 257/777 |
| 6,046,910 | A | * | 4/2000  | Ghaem et al. ................. 361/760 |

(Continued)

FOREIGN PATENT DOCUMENTS

| JP | 04-236435 | * | 1/1991 |
| JP | 04-236435 |   | 8/1992 |

(Continued)

OTHER PUBLICATIONS

International Search Report dated Jul. 27, 2005.

*Primary Examiner* — David Angwin
(74) *Attorney, Agent, or Firm* — Katherine S. Brown

(57) ABSTRACT

A method and system for improving alignment precision of a pair of MEMS parts. The method involves stacking the two parts such that at least one rolling element is between facing surfaces of said two parts, and each rolling element has a first diameter and an axis of rotation parallel to the facing surfaces. The first and second of a pair of MEMS parts respectively include a first alignment pad and a second alignment pad and a liquid drop formed in contact with both alignment pads can align the two parts which can then be locked together by solidification of solder while remaining spaced by the first diameter.

8 Claims, 4 Drawing Sheets

(56) References Cited

U.S. PATENT DOCUMENTS

| | | | |
|---|---|---|---|
| 6,048,430 A * | 4/2000 | Johnston | 156/233 |
| 6,133,637 A * | 10/2000 | Hikita et al. | 257/777 |
| 6,163,160 A * | 12/2000 | Hanrahan et al. | 324/750.25 |
| 6,225,699 B1 * | 5/2001 | Ference et al. | 257/777 |
| 6,229,217 B1 * | 5/2001 | Fukui et al. | 257/777 |
| 6,229,319 B1 * | 5/2001 | Johnson | 324/754.09 |
| 6,236,109 B1 * | 5/2001 | Hsuan et al. | 257/688 |
| 6,265,775 B1 * | 7/2001 | Seyyedy | 257/737 |
| 6,271,110 B1 * | 8/2001 | Yamaguchi et al. | 438/613 |
| 7,303,339 B2 * | 12/2007 | Zhou et al. | 385/91 |
| 2003/0053756 A1 * | 3/2003 | Lam et al. | 385/49 |
| 2003/0146518 A1 * | 8/2003 | Hikita et al. | 257/777 |
| 2004/0042729 A1 * | 3/2004 | Zhou et al. | 385/49 |
| 2005/0016763 A1 * | 1/2005 | Zollo et al. | 174/256 |
| 2005/0161252 A1 * | 7/2005 | Birgel | 174/260 |
| 2009/0211087 A1 * | 8/2009 | Oggioni et al. | 29/834 |

FOREIGN PATENT DOCUMENTS

| | | |
|---|---|---|
| JP | 07-058150 | 3/1995 |
| JP | 09-326535 | 12/1997 |
| JP | 21053109 A2 | 2/2001 |
| JP | 2001053109 | 6/2001 |
| JP | 2003-523085 A | 7/2003 |
| TW | 584946 | 4/2004 |

\* cited by examiner

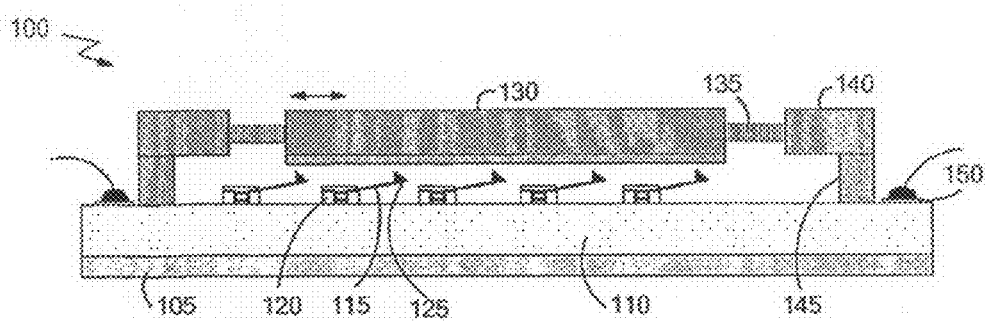
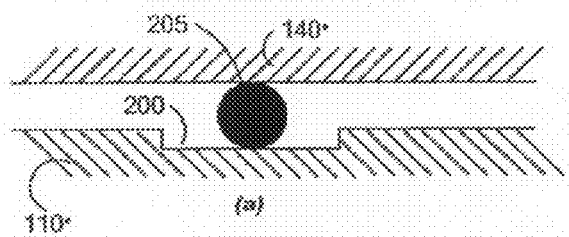
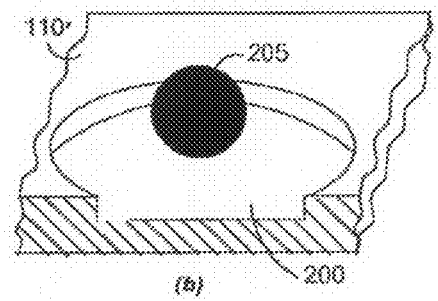
Figure 2
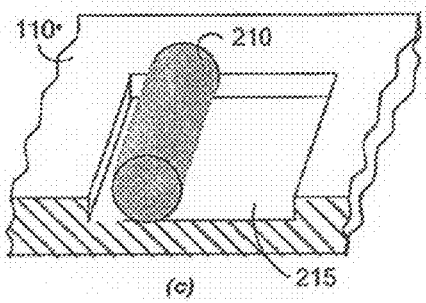
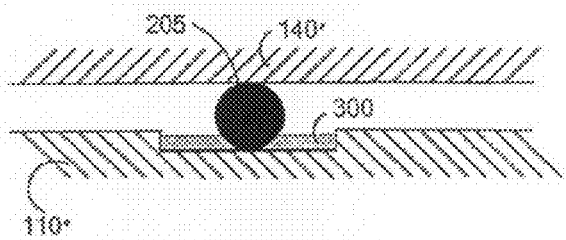
Figure 3
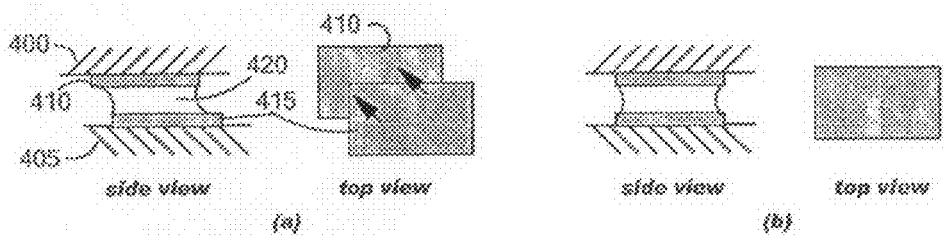
Figure 4

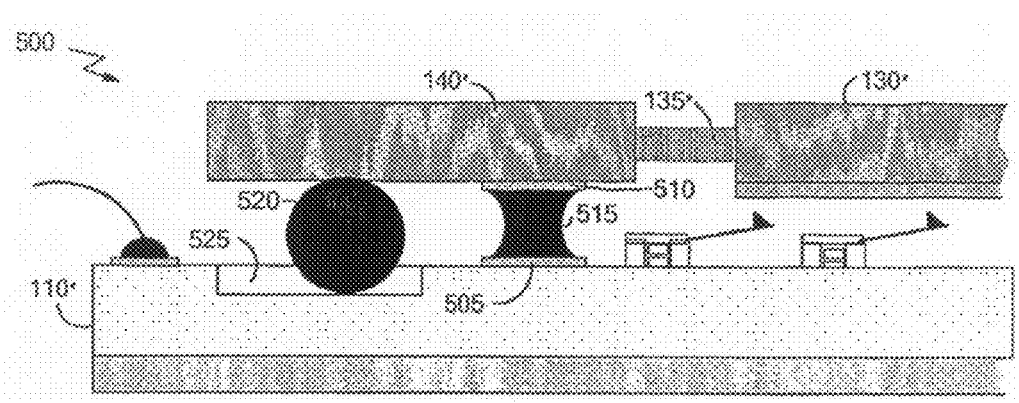
Figure 5
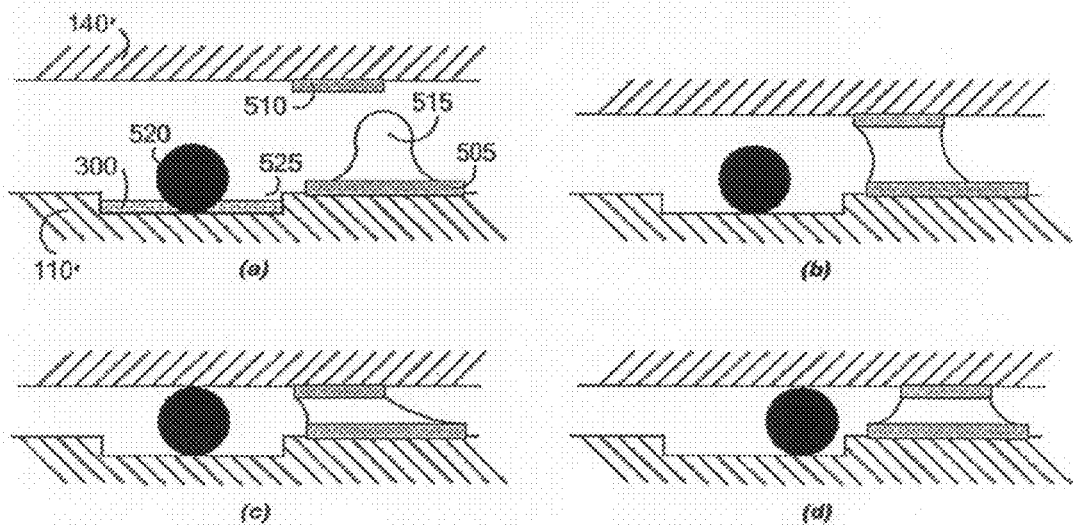
Figure 6
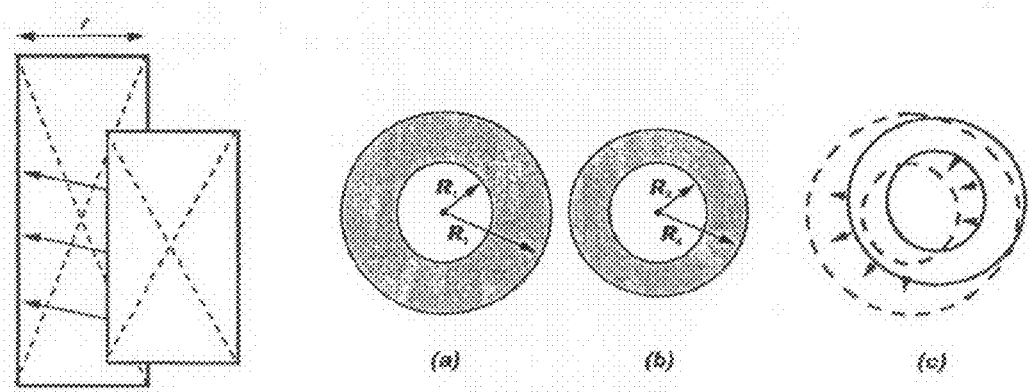
Figure 8
Figure 9

METHOD AND SYSTEM FOR IMPROVING ALIGNMENT PRECISION OF PARTS IN MEMS

FIELD OF THE INVENTION

The present invention relates generally to fabrication techniques and Micro-Electro Mechanical Systems (MEMS) and more specifically to a method systems for improving alignment precision of parts in MEMS during manufacturing.

BACKGROUND OF THE INVENTION

Micron-sized mechanical structures cofabricated with electrical devices or circuitry using conventional Integrated Circuit (IC) methodologies are called micro-electromechanical systems or MEMS. There has been great deal of recent interest in the development of MEMS devices for applications such as devices, displays, sensors and data storage devices. For example, one of IBM's projects concerning data storage device demonstrates a data density of a trillion bits per square inch, 20 times higher than the densest magnetic storage currently available. The device uses thousands of nanometer-sharp tips to punch indentations representing individual bits into a thin plastic film. The result is akin to a nanotech version of the data processing 'punch card' developed more than 110 years ago, but with two crucial differences: the used technology is re-writeable (meaning it can be used over and over again), and may be able to store more than 3 billion bits of data in the space occupied by just one hole in a standard punch card.

The core of the device is a two-dimensional array of v-shaped silicon cantilevers that are 0.5 micrometers thick and 70 micrometers long. At the end of each cantilever is a downward-pointing tip less than 2 micrometers long. The current experimental setup contains a 3 mm by 3 mm array of 1,024 (32×=) cantilevers, which are created by silicon surface micro-machining. A sophisticated design ensures accurate leveling of the tip array with respect to the storage medium and dampens electronics, similar to that used in DRAM chips, address each tip individually for parallel operation. Electromagnetic actuation precisely moves the storage medium beneath the array in both the x- and y- directions, enabling each tip to read and write within its own storage field of 100 micrometers on a side. The short distances to be covered help ensure low power consumption.

FIG. 1 is a partial cross section view of such device (100). As shown each cantilever 115 is mounted on a substrate 105 surmounted by a CMOS device 110, with a control structure 120, and comprises a downward-pointing tip 125 that is adapted to read or write (R/W) a bit on the surface of the storage scanner table 130. Thanks to electromagnetic actuator 135 storage scanner table 130 can move in at least one dimension as illustrated by arrows. The part comprising the storage scanner table 130, the actuator 135 and the support structure 140 must be precisely aligned on the CMOS device 110, at a predetermined distance. CMOS device 110 has all the required electronics to control required functions such as R/W operations. In this implementation example, alignment functional targets in X and Y axis are on the order of ±10 μm (micrometer), while the functional gap between the storage scanner table 150 and the CMOS device 110 that works also as a supporting plate for the R/W cantilevers has a maximum distance of 6 μm with sub-micron tolerance.

The combination of electrical and mechanical features associated with the required part alignment accuracy leads to the use of dedicated manufacturing tools that directly impacts device cost. In the high volume production of this kind of product for the consumer market such investments would become very high due to an intrinsic conflict between throughput (capacity) and precision alignment requirements. Therefore, there is a need for a method and systems for aligning efficiently parts of the MEWS during manufacturing, without requiring dedicated and complex manufacturing tools.

SUMMARY OF THE INVENTION

Thus, it is a broad object of the invention to remedy the shortcomings of the prior art as described here above.

It is another object of the invention to provide a method and systems for reducing the friction between MEMS parts when aligning them.

It is a further object of the invention to provide a method and systems for improving self-alignment precision of MEMS parts during manufacturing while controlling the distance between these parts.

It is still a further object of the invention to provide a method and systems for improving self-alignment precision of MEMS parts during manufacturing, according to rotational misalignment, while controlling the distance between these parts.

The accomplishment of these and other related objects is achieved by a method for improving alignment precision of at least two parts of an electronic device, the at least two parts being in contact through at least one rolling element, the method comprising the steps of, aligning the at least two parts and locking the at least two parts together.

Further advantages of the present invention will become apparent to the ones skilled in the art upon examination of the drawings and detailed description. It is intended that any additional advantages be incorporated herein.

BRIEF DESCRIPTION OF THE DRAWINGS

FIG. 1 is a partial cross section view of a device wherein the invention can be efficiently implemented.

FIG. 2, comprising FIGS. 2a, 2b, and 2c, illustrates the mechanism of the invention for reducing the friction between HEMS parts to be aligned, for improving alignment precision.

FIG. 3 depicts how the spheres or bearings of FIG. 2 are temporarily blocked.

FIG. 4, comprising FIGS. 4a and 4b, illustrates the concept of solder-reflow alignment process that can be used in conjunction with the friction reduction mechanism of FIG. 24.

FIG. 5 is a partial cross section view of the device of FIG. 1 wherein the invention is implemented.

FIG. 6, comprising FIGS. 6a, 6a, 6c, and 6d, illustrates the main steps of a first embodiment for the self-alignment of MEMS parts.

FIGS. 8 and 9 show the shapes of the pads used for aligning MEMS parts according to the first embodiment.

FIGS. 10a, 10b, 10c and 10d, shows an example of the control of the pad sizes and the alloy volumes.

DETAILED DESCRIPTION OF THE PREFERRED EMBODIMENT

Figure 7:
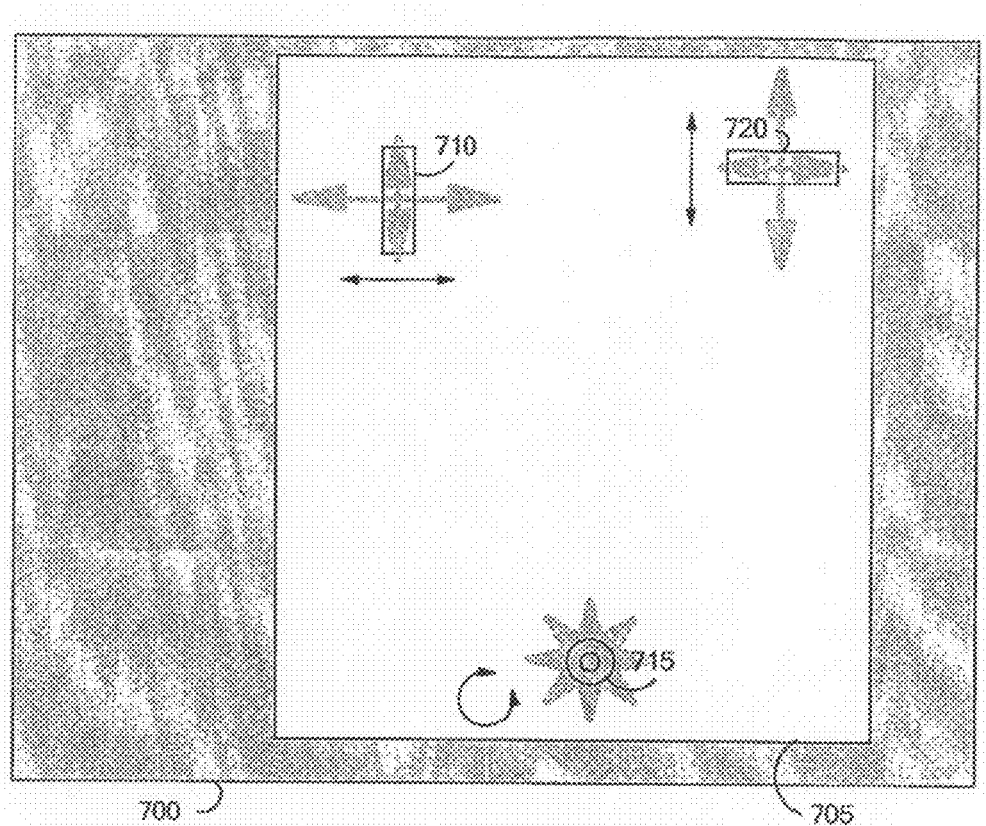
FIG. 7 illustrated a partial plan view of a device wherein the invention is implemented and shows the dominant force vectors based on each pad design, according to the first embodiment.

According to the invention there is provided a design strategy allowing stacking two or more parts of Micro-Electro Mechanical Systems (MEMS) with very high precise position via either a solder-reflow process, which could also torn a final electrical and/or mechanical connection between the parts of the MEMS, a gravitational effect based process, or a combination of both. Furthermore the invention offers a self controlled correction of rotational placement errors and a self forced Z controlled height or functional standoff.

For sake of illustration, the description of the invention is based upon the example given above by reference to FIG. 1 concerning a data storage device. Such data storage device is made of a MEMS with a moving table, also referred to as a scanner or scanner table, and related electromagnetic controls, a CMOS device that has all the required electronics to control read and write (R/W) function performance and carrying a great number of single structures that are the R/W tips.

As mentioned above, there are precise functional requirements for the part stack-up. Alignment functional targets in X and Y axis are in the order of ±10 μm (micrometer), while the functional gap between the scanner table and the CMOS device that works also as a supporting plate for the R/W cantilevers has a maximum distance of 6 μm with sub-micron tolerance.

According to the invention, the alignment system is based upon the use of rolling spheres or bearings to reduce friction between the moving parts of the MEMS. Preferably the spheres or bearings are placed into cavities or niches that are present on one of the stacking elements. Such cavities can be, for example, etched on the surface of MEMS part. It is to be noticed that cylindrical bearings rotating along their main axis offer to move rotating along their center offer to move parts along x and y directions. It is also to be noticed that the spheres and bearings are used as spacers to provide a precise control of the distance between MEMS parts.

FIG. 2, comprising FIGS. 2a, 2b, and 2c, illustrates the above mentioned spheres and bearings.

FIG. 2a is a partial cross section view of two MEMS parts e.g., a CMOS device 110' and a structure 140' supporting a storage scanner table, similar to the ones shown on FIG. 1. CMOS device 110' comprises a cavity 200 wherein a sphere 205 can rotate so that CMOS device 110' and structure 140' supporting a storage scanner table can be aligned with a low friction coefficient. Preferably, the system comprises three spheres (or two spheres and one bearing, one sphere and two bearings, or three bearings) that are not aligned so as to create three interface points between MEMS parts to align. FIG. 2b shows the preferred shape of cavity 200 consisting in a cylinder that axis is perpendicular to the plan formed by the interface points between MEMS parts to align. FIG. 2c illustrates the use of a bearing 210 and the preferred shape of the corresponding cavity 215. As shown, the preferred shape of the corresponding cavity 215 is a rectangular parallelepiped.

The rolling spheres or bearings that can be made of Tungsten carbide, offer a low friction coefficient to the moving parts that have relative movement in respect to each others. Cavities hosting the spheres or bearings are made of a size such to encompass mainly the positioning tolerances of the stacked parts of the MEMS plus all the required manufacturing tolerances. For example, the sphere can have a diameter of 7 μm, the cavities having a depth of 1 μm.

Still preferably, the spheres or bearings are maintained and centered in the cavities before positioning the MEMS parts. As illustrated on FIG. 3, rotational elements are kept in their position by a temperature dissipative material 300, that frees the rotational elements when other mechanisms are supposed to take over the relative positioning of the MEMS parts. Preferably, the temperature dissipative material consists of a gel comprising water and glycerol. This gel fully dissipates during the temperature excursion in the front end portion of a soldering reflow profile, between approximately 80° and 130° C. and that typically has to last at least 140 seconds. This gel evaporates and leaves no residues that keep the spheres from rolling when the two parts of the stacked MEMS start to move. The gel may be obtained by mixing 10 g of glycerol and 6 g of water, stirred at a temperature greater than 45°C. in a vacuum chamber until the gel is formed by volume reduction and loss of water. Vacuum mixing increases the water evaporation rate at lower temperature and avoid the trapping of air bubbles within the gel formation during the mixing operation. Gel can be dispensed by a kind of shower head placing a dot of gel into the cavities, this shower head can actively dispenses the gel e.g., by injecting the gel through needles, or transfer the gel in a passive way. Another solution consists in dipping the spheres or bearings into the gel before placing them into cavities.

Once the alignment has taken place the locking mechanisms of the stacked MEMS, such as soldering, hold the spheres or bearings in place by friction.

As mentioned above, the self-alignment of MEMS parts, using low cost industrial processes, can result from a specific soldering process, from a particular shape of the floor of the rotational element cavities, or from a combination of both.

The implementation of specific design of metal pads and the utilization of selected soldering alloys such as standard eutectic Tin/Lead (63Sn/37Pb) or non eutectic Sn/Pb binary alloys such as Sn60/40Pb or 5Sn/95 Pb, 10Sn/90Pb, 3Sn/97Pb or other "Lead-free" alloys such as Tin/Silver/Copper ternary alloys or other alloys that can be based on Indium or Silver, or Tin or other metals alloys allows taking advantage of the surface tension physics of the melted alloy deposit. Solder alloy can be selected based on the solder hierarchy required in the overall product manufacturing system and based on maximum acceptable temperature excursions that the different MEMS components can withstand to. The wetting phenomenon between the metal pads and the alloy in liquid phase drives the self centering operation along the X and Y axis between the two parts of the MEMS as illustrated on FIG. 4 that shows two parts (400, 405) of the MEMS, each comprising a pad (410, 415) in contact with alloy (420), at the beginning (a) and at the end (b) of the reflow process.

These tension effects in molten solder can also be used to create, when required in the same design, a complex system of forces for rotational self-alignment (theta axis) by creating moments to pivot around various features. Additionally, by adjusting the relative sizes of pads and amount of alloy, the pressure exerted on the rotation element can be controlled.

FIG. 5 illustrates a device 500, wherein one embodiment of the invention is implemented, comprising two metal pads 505 and 510, linked by soldering alloy 515. As mentioned above, the distance between the MEMS parts e.g., between CMOS device 110' and the part comprising the storage scanner table 130', the electromagnetic actuator 135', and the structure 140', is determined according to the diameter of the rotational element 520 and the depth of the corresponding cavity 525.

According to the device shown on FIG. 5, the X, Y, and theta alignments can be performed, along with the Z collapse against rotational elements, in a single reflow step.

FIG. 6, comprising FIGS. 6a, 6b, 6c, and 6d, illustrates the main steps of the alignment of MEMS parts. As shown on FIG. 6a, the structure 140' supporting the storage scanner table comprises a pad 510 and the CMOS device 110' comprises a pad 505 and a cavity 525 wherein a sphere is maintained and centered by a temperature dissipative material 300 such as a gel comprising water and glycerol. A predefined amount of soldering material 515 is deposited on pad 505. When CMOS device 110' and structure 140' supporting the storage scanner table are aligned, pads 505 and 510 are also aligned.

As described above, the temperature dissipative material 300 starts to dissipate during the first step of the soldering reflow process and continues up to complete dissipation while the temperature reaches the melting point of the soldering material 515. The soldering material changes states and starts to wet the pad 510 as depicted on FIG. 6b. The MEMS parts collapse one on top of the other until they hit the sphere 520, as shown on FIG. 6c, that is free to accommodate a movement of the MEMS parts that are self-aligning as described by reference to FIG. 4. At the end of the self-alignment process, the pads 505 and 510 are aligned and the temperature is decreased, locking MEMS parts together, as depicted on FIG. 6d.

Each pad design is inspired by the location and the resulting contribution of the same to the resulting forces that will drive the self alignment of the stacked MEMS parts Preferably, each MEMS part to be aligned comprises at least three pads, at least a portion of each pad of a part being exactly aligned to one pad of the other part when parts are precisely aligned. In a preferred embodiment, there are three pads forming a triangle i.e., defining a plane, two of them being long rectangular pads, these have demonstrated to have a stronger pulling force along the direction orthogonal to the long side. These rectangular pads, being disposed according to an angle of approximately 90°, are responsible to give a consistent contribution to the X and Y macro-alignment but are responsible to achieve a precise micro-alignment but are responsible to achieve a precise micro-alignment (sub-micron level) of the metal pads and then of the MEMS parts. Making the pads rectangular and with a high aspect ratio between the two sides is also satisfying one of the requirements for the collapsing feature of the Z control process.

The third pad has to maintain the same X and Y recovering action (forces) but it can be at a lower level when it is basically centered but has the option of becoming a strong contributor to the self centering forces when the misplacement is at macro-level (tens of microns). The other main function of the latter pad design is to act as a pivotal point and to allow slight rotation of the system in association with the acting forces driven by the other two rectangular pads.

The definition of the design characteristics for the third pad resulted in a pad with a profile similar to a "Donut" where the resulting forces act along the pad as if the pad itself would be a long rectangular pad, with a high ratio between the two different edges, something very similar to the two remaining pads.

The melted alloy will wet the mating pads creating the aligning forces driving a complete and low surface energy 3D structure that can be reached only when an exact overlap of the wettable surfaces (pads) is present.

FIG. 7 illustrated a partial view of a device wherein the invention is implemented and shows the dominant forces vectors (arrows) based on each pad design. As illustrated, a MEMS part 700 comprises pads 710, 715 and 720 that are aligned to corresponding pads of another MEMS part 705, allowing the alignment of parts 700 and 705 during the solder-reflow process FIG. 8 depicts the corresponding pads of two MEMS parts i.e., a pair of pads, as well as the dominant forces allowing their alignment. As it is understandable from this drawing, both pads should have approximately the same widths $l$ and different lengths so as to determine a main alignment direction. The greater misalignment distance that can be corrected is equal to approximately the half of the pad width i.e., $l/2$.

FIG. 9, comprising FIGS. 9a, 9b, and 9c, illustrates an example of pad design for the above discussed third pair of pads used as a pivotal point. Preferably, the internal radiuses $R_1$ and $R_2$ of the annular ring of both pads are equal, $R_1=R_2$, while the external. radius of one of the pads is greater than the external radius of the second pad e.g., $R_3>R_2$. The greater misalignment distance that can be corrected is equal to approximately the half of the difference between the external radiuses of both pads i,e., $(R_3-R_4)/2$.

Therefore, the use of two similar pair of rectangular pads, one pair being rotated of an angle approximately equal to 90° from the other, and of an annular pair of pads as discussed above, allows an X and Y alignment as well as a rotational adjustment.

The amount of soldering material used between corresponding pads for self-aligning MEMS parts and for soldering them must be precisely predetermined. It must be great enough to ensure contact between pads and efficient tension effects for aligning MEMS parts but it must not be too great so as to guarantee that spheres are in contacts with both MEMS parts.

The resulting combination available volume or soldering alloy paired with the available wettable surfaces drives a distribution of the solder volume achieving a 3D structure with the minimum surface energy.

The required amount of soldering q material is reached by underestimation of the required volume, at equilibrium, for a specific height and pads surfaces. This will create an over consumption of the alloy with a resulting collapsing action that would tend to reduce the gap beyond what is imposed by the presence of the spheres.

Figure 10:
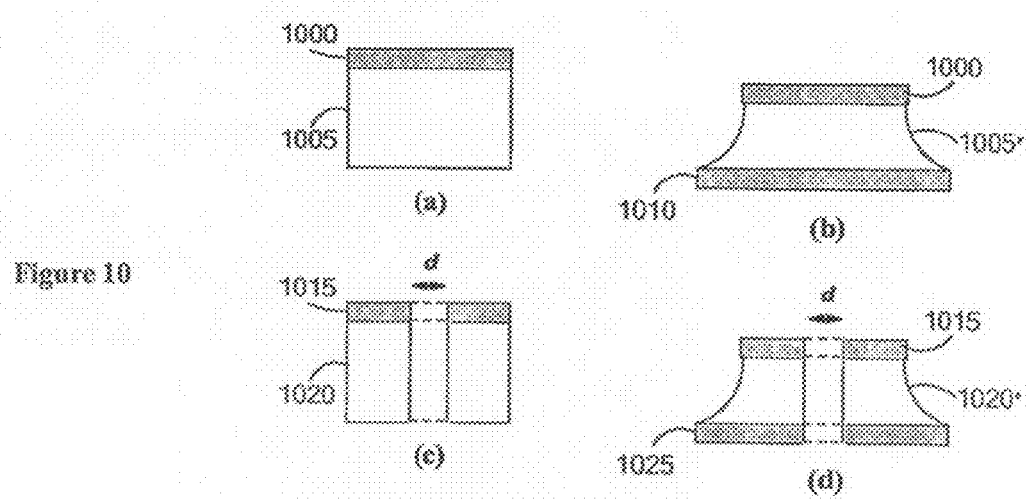
FIG. 10, comprising

FIG. 10 and the following tables show an example of the different pad dimensioning based on the possible/available solder alloy volumes. Processes to deposit such small amount of soldering alloy do have different costs and different tolerance to the targeted volume. The tables were used to design targeted volumes with different surface areas based on steps of fixed solder deposits.

FIG. 10a illustrates a rectangular pad (1000) configuration after solder (1005) deposition and FIG. 10b shows the rectangular pads (1000, 1010) configuration after self-alignment operation and solder (1005') consumption. The geometrical configuration is then computed with good approximation to a pyramidal frustum with parallel faces.

Assuming that,
b is the area of the pad (1000), on which alloy is deposited, that width and length are both equal to 100 μm,
B is the area of the receiving pad (1010) that width is equal to 100 μm,
h is the height of alloy deposition, prior to joining and its value is a variable of solder deposition process capability for very small volumes. The value of h may be an independent variable that drives the overall sizing of the pads geometry,
H is the targeted height of alloy between pads (1000, 1010), and,
V is the alloy volume, then, $$V = H \cdot \frac{B + b + \sqrt{B \cdot b}}{3} \quad (1)$$

and the length of the receiving pad (1010) is:

| Height of alloy dep. h(μm) | 15 | 14 | 13 | 12 | 10 |
|---|---|---|---|---|---|
| Receiving pad length (μm) | 560 | 510 | 460 | 410 | 320 |

Likewise, FIG. 10c illustrates an annular pad (1015) configuration after solder (1020) deposition and FIG. 10d shows the annular pads (1015, 1025) configuration after self-alignment operation and solder (1020') consumption. The geometrical configuration is then computed with good approximation to a conical frustum with parallel faces and a cylindrical cavity of volume $\pi R^2_1 H$ in the center.

Assuming that, $R_1$ and $R_2$ are the radiuses of the empty circular areas in the center of both annular pads (1015, 1025), $R_1$ and $R_2$ are both equal to 50 μm, $R_4$ is the external radius of the pad (1015), on which alloy is deposited, it is equal to 150 μm, $R_3$ is the external radius of the receiving pad (1025)

h is the height of alloy deposition, prior to joining and its value is a variable of the capability of the solder deposition process for depositing very small volumes. The value of h may be an independent variable that drives the overall sizing of the pad geometry, H is the targeted height of alloy between pads (1015, 1025), and, V is the alloy volume, then, $$V = H\pi \cdot \left( \frac{R_3^2 + R_3 R_4 + R_4^2}{3} - R_1^2 \right) \quad (2)$$

and the external radius $R_3$ of the receiving pad (1025) is:

| Height of alloy dep. h(μm) | 15 | 14 | 13 | 12 | 10 |
|---|---|---|---|---|---|
| Receiving pad radius (μm) | 340 | 325 | 310 | 290 | 260 |

Figure 11:
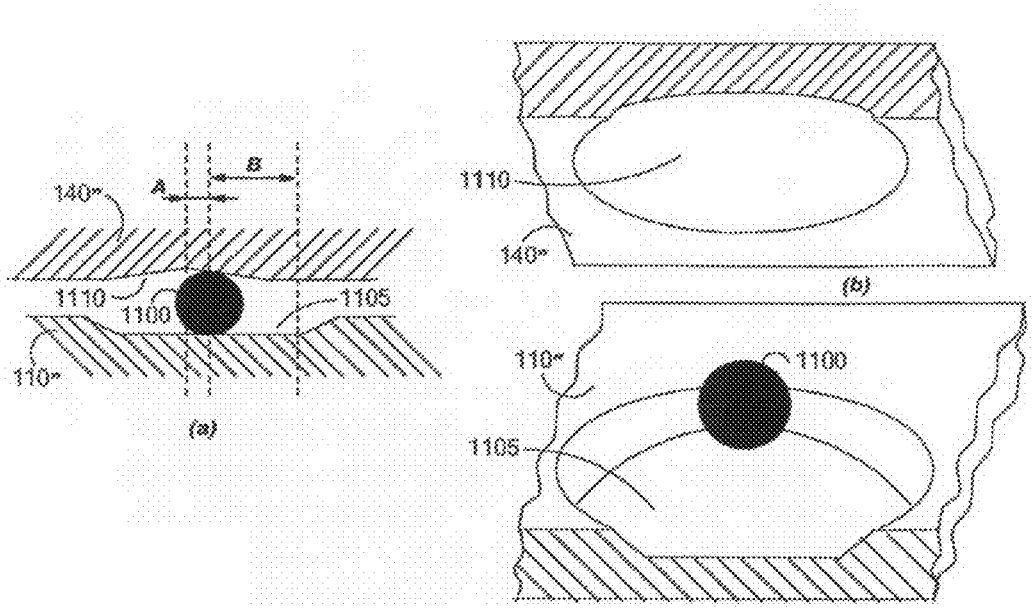
FIG. 11 depicts a second embodiment for self-aligning MEMS parts, using gravitational effect.

In another embodiment the self-alignment process uses gravitational effect. According to this embodiment, there are two complementary etched cavities on the two mating surfaces of the MEMS parts. As shown on FIG. 11, wherein FIG. 11a depicts a partial cross section view of MEMS parts 110" and 140" and FIG. 11b depicts the corresponding partial perspective view, the cavity 1105 formed in CMOS device 110" and FIG. 11b depicts the corresponding partial perspective view, the cavity 1105 formed in CMOS device 110" looks like a flattened cone and the cavity 1110 formed in the structure 140" is a cone. Cavity 1105 comprises a flat floor wherein the sphere 1100 is centered and maintain with a temperature dissipative material, such as a get, as mentioned above, and wherein the sphere can freely roll when the temperature dissipative material is evaporated. The conical shape of cavity 1110 allows the sphere to be self-aligned with the cone center due to gravitational effect, to reach a stable state. The cavities are formed such that MEMS parts are aligned when the sphere is aligned with the cone center of cavity 1110. The distance A between the centers of cavities 1105 and 1110 corresponds to the misplacement of the top MEMS part while distance B, being equal to the radius of the flattened cone smaller face, is the maximum distance that can be recovered according to the self-aligning mechanism.

Figure 12:
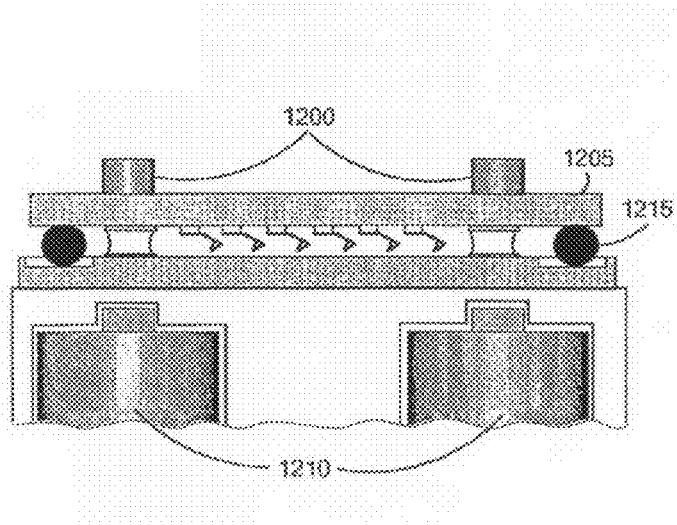
FIG. 12 illustrates an apparatus for applying a Z force to increase the gravitational effect.

FIG. 12 illustrates an apparatus for applying a Z force to increase the gravitational effect. Small, light, magnetic "weights" 1200 are placed on top of the upper MEMS part 1205, in a manner which is well centered over the solder joints, or a subset of the solder joints. Magnetic solenoids 1210 with switchable current (and therefore switchable field) are located in a manner below the parts being joined, such that they are well-centered under each magnetic weight. If these solenoids and weights have well-behaved fields (and no other ferromagnetic structures are present which would distort the fields from the solenoids), then the force on each magnetic weight is purely vertical (has no in-plane component) to within a given tolerance.

When the field in the solenoids is switched on, the magnetic weights produce a vertical force on the upper MEMS part 1205, driving the part against the sphere 1215 allowing the alignment of MEMS parts according to shapes of cavities. The amount of force is determined by the size and magnetic permeability of the magnetic weights, and the design of and current applied to the solenoids.

The magnetic weights are placed by robotics or other means prior to the start of the reflow process. A single light-weight structure with magnetic inclusions at the proper locations can simplify the placement of the magnetic components. Gravity should be sufficient in most cases to hold the magnetic weights in the proper locations. After cooling, the magnetic weights can be lifted off the bonded stack.

Placement of the magnetic masses may also be aided by providing grooves or other alignment feature in the top of the upper MEMS part. If cone-shaped, cylindrical, or square depressions are provided in the upper MEMS part, steel balls (which are widely available at low cost with precisely controlled dimensions) may be used as the magnetic weights.

After the MEMS parts have been aligned a soldering process may be applied to lock the parts together.

Even if the described example is based upon the use of glycerol based gel for maintaining the rolling spheres/bearings before aligning the MEMS parts, it must be understood that other materials can be used. Other applications can use materials to hold the rolling spheres/bearings that do not fully dissipates during the thermal cycle but simply liquefy to a point of not being of impediments on the movement of the spheres while the joining of the moving parts is achieved and then resolidify when the parts cool down. These materials comprise natural or synthetic waxes or rosins e.g., paraffin or colophony (pine tree resin). Likewise, the thermally dissipative material compositions can include the usage of hydrocolloids, e.g. gum arabic, gum karaya, gum agar, guam gum.

Naturally, in order to satisfy local and specific requirements, a person skilled in the art may apply to the solution described above many modifications and alterations all of which, however, are included within the scope of protection of the invention as defined by the following claims.

The invention claimed is:

1. A method for improving alignment precision of two parts of an electronic device, wherein a first part and a second part of said two parts respectively include a first alignment pad and a second alignment pad, said method comprising the steps of, stacking said two parts, wherein at least one rolling element is between facing surfaces of said two parts, and each rolling element has a first diameter and an axis of rotation parallel to said facing surfaces, maintaining said at least one rolling element on one of said two parts, before aligning said two parts, using at thermally dissipative material that comprises glycerol, forming a liquid drop in contact with both said first alignment pad and said second alignment pad to align said two parts and, locking said two parts together whereby said two parts remain spaced by said first diameter, said locking achieved by solidification of solder.

2. The method of claim 1 further comprising the step of freeing said at least one rolling element before aligning said two parts.

3. The method of claim 1 wherein said rolling element is either a sphere or a bearing.

4. The method of claim 1 wherein at least one of said two parts comprises a cavity, said rolling element being centered in said cavity before aligning said two parts.

5. The method according to claim 1 wherein the upper one of said two parts comprises a conical cavity adapted to cooperate with said rolling element.

6. The method according to claim 1 wherein the size of said first and second alignment pads being different.

7. The method of claim 1 wherein said rolling element comprises tungsten carbide or steel.

8. The method of claim 1 wherein said aligning is at a temperature sufficient to cause solder reflow.

\* \* \* \* \*